United States Patent [19]

Hoffman

[11] Patent Number: 5,073,730
[45] Date of Patent: Dec. 17, 1991

[54] CURRENT TRANSIENT REDUCTION FOR VLSI CHIPS

[75] Inventor: Charles R. Hoffman, Raleigh, N.C.
[73] Assignee: International Business Machines Corporation, Armonk, N.Y.
[21] Appl. No.: 513,530
[22] Filed: Apr. 23, 1990
[51] Int. Cl.$^5$ .............................................. H03K 5/20
[52] U.S. Cl. .................................. 307/480; 307/262; 307/269; 307/475; 328/75; 328/155
[58] Field of Search .................. 328/155, 75; 307/262, 307/269, 480, 473, 475

[56] References Cited

U.S. PATENT DOCUMENTS

| | | | |
|---|---|---|---|
| 3,603,810 | 9/1971 | Clayson | 328/75 |
| 4,112,380 | 9/1978 | Thatcher | 307/262 |
| 4,484,154 | 11/1984 | Pavin | 307/262 |
| 4,574,345 | 3/1986 | Konesky | 364/200 |
| 4,626,716 | 12/1986 | Miki | 307/590 |
| 4,713,621 | 12/1987 | Nakamura et al. | 307/269 |
| 4,754,164 | 6/1988 | Flora et al. | 307/269 |

FOREIGN PATENT DOCUMENTS

| | | | |
|---|---|---|---|
| 0148426 | 8/1984 | Japan | 307/443 |
| 0190020 | 9/1985 | Japan | 307/443 |

*Primary Examiner*—Stanley D. Miller
*Assistant Examiner*—Toan Tran
*Attorney, Agent, or Firm*—Joscelyn G. Cockburn

[57] ABSTRACT

Described is a circuit arrangement for controlling peak transient current on data buses of VLSI chips. The circuit arrangement includes a phase lock loop (PLL) with a voltage control oscillator (VCO) made up of high speed inverter circuits that generate very short time interval pulses that are used to control the switching sequence of drivers onto the buses. As a result, the transients are distributed over a relatively short time interval and data throughput on the buses is not adversely affected.

9 Claims, 3 Drawing Sheets

CURRENT TRANSIENT REDUCTION FOR VLSI CHIPS

CROSS REFERENCE TO RELATED PATENT APPLICATION

The present invention relates to patent application Ser. No. (RA9-89-033) entitled, "CMOS Driver" and assigned to the assignee of the present invention. The referenced application describes a circuit arrangement for a CMOS driver in which current transient (di/dt) is significantly reduced.

BACKGROUND OF THE INVENTION

1. Field of the Invention

The present invention relates to VLSI chips in general and in particular to the control of electrical noise, electromagnetic interference (EMI) etc., in said chips.

2. Prior Art

Even though the CMOS logic family has several attractive characteristics, its full potential has not been developed because of its reputation of being the noisiest of all the known logic families. As circuit speeds and chip densities increase, it is believed that the noise problems will also increase. This will tend to further limit the use of the CMOS circuit family.

The noise problem is particularly associated with CMOS driver circuits which are sometimes called output buffers. The buffers can be used to drive off chip circuits, on chip internal nets, buses, etc. A conventional CMOS driver or buffer uses two series connected FET devices which should switch sequentially under ideal conditions. However, this ideal condition is never met in practice. Instead, both devices switch simultaneously, thus resulting in a high current transient (di/dt). The high current transient causes ground voltage bounce, noise coupling and radiation problems. A detailed description of ground bounce and other noise associated problems is set forth in the above referenced patent application and documents cited therein. Both the patent application and cited documents are incorporated herein by reference.

The prior art approach for controlling noise is to control the output devices so that only one device conducts at a particular instant of time. Even though this approach works well for its intended purpose, it only applies to single drivers. The prior art technique does not address the noise problem caused by multiple drivers and/or buses.

Another cause of noise in VLSI chips is the simultaneous switching of multiple drivers and/or buses. Because VLSI chips could have multiple buses which could all be switched at the same time, tens or even hundreds of driver circuits could be simultaneously switched to cause objectionable high current transients (di/dt). In fact, this high current transient could be present even though individual drivers are designed to produce non-objectionable current transients for a single signal line.

An example of controlling the outputs from multiple drivers is set forth in U.S. Pat. No. 4,724,340. In this patent, the time prior to a data valid interval is used to set the states of output links to a predetermined value that will insure that no more than half of the I/O drivers will simultaneously switch in the same direction (i.e., On-to-Off or Off-to-On). At best, this approach can only improve the di/dt problem by a factor of 0.5 and may not be acceptable in several situations.

SUMMARY OF THE PRESENT INVENTION

It is therefore the general object of the present invention to provide VLSI chips having multiple bus drivers but do not cause unacceptable current and/or voltage transients.

This object and others are achieved by providing a circuit arrangement that controls the bus drivers or groups of bus drivers so that switching is spread over a relatively short portion or intervalve of the bus cycle time period. This results in a significant reduction in current and/or voltage transients. Thus, the present invention provides a much quieter VLSI chip.

The circuit arrangement includes a phase-locked loop (PLL) with a multi-stage voltage controlled oscillator (VCO) therein. Each stage of the multi-stage VCO generates a control pulse which is combined with other signals in a gating circuit whose output sequence a selected driver onto the data bus. In one feature, each control pulse sequence a group of selected drivers onto the data bus. In another feature of the invention, the VCO is formed from inverters.

The foregoing features and advantages of the invention will be more fully described in the accompanying drawings.

DESCRIPTION OF THE INVENTION

Figure 1:
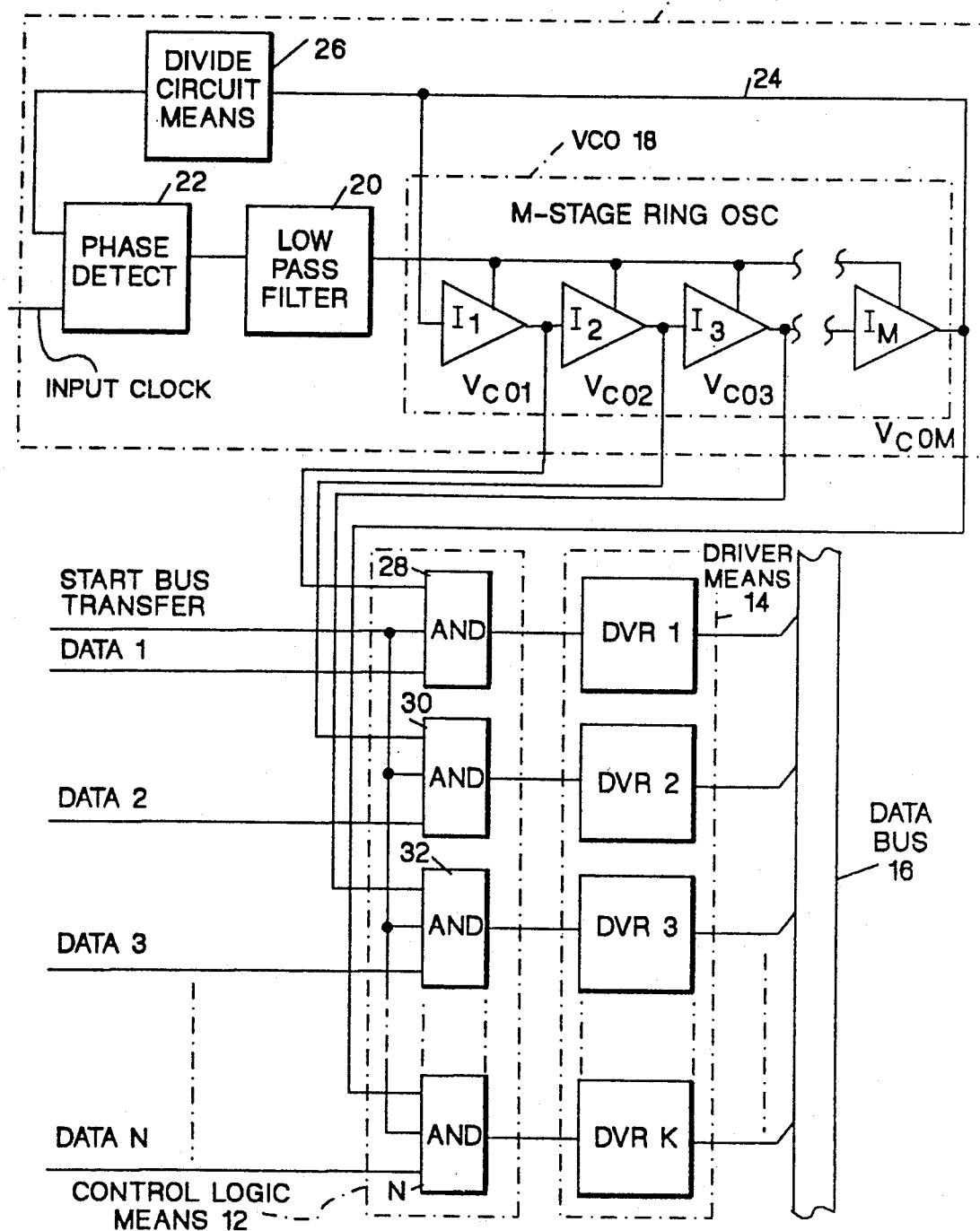
FIG. 1 shows a circuit diagram of a precision time interval generator according to the teachings of the present invention.

FIG. 1 shows a circuit diagram of an integrated circuit according to the teachings of the present invention. The integrated circuit includes phase lock loop 10, control logic circuit means 12, driver means 14 and data bus means 16. The phase lock loop 10 includes a VCO 18 which is a multi-state ring oscillator formed from a plurality of inverter circuits Il through IM. A low pass filter circuit means 20 has its output terminal connected to the control terminal of each of the inverter circuits Il through IM. The input to the low pass filter circuit means 20 is generated from a phase detector circuit means 22. One input of the phase detector circuit means 22 is connected to an input clock lead. In one embodiment of the present invention, the input clock signal is derived from the system clock. The other input to the phase detector circuit means 22 is from the output of the last inverter (IM) of the inverter chain. Conductor 24 interconnects the output from inverter IM to phase detector means 22. Divide circuit means 26 is inserted in the feedback loop and can be used to adjust the period of the VCO independent of the input clock frequency.

Still referring to FIG. 1, each of the inverter generates a pulse stream VCO1, VCO2 through VCOM, M being the last inverter in the string of inverters. As will be explained subsequently, each of the control pulse train is used to gate control logic means 12 to allow respective ones of the driver circuit access to data bus 16. The control logic means 12 includes a plurality of And gates 28 through N, where N is the last gate in the chain of And gates. The outputs from each of the inverter stage of the ring oscillator is used for controlling an assigned one of the And gates. Thus, VCO1 controls And gate 28, VCO2 controls And gate 30 and so forth. In addition to the signal outputted from a respective inverter, each And gate receives an input data bit on one of the input data lines 1 through N' and a common control signal labeled Start Bus Transfer. This signal is delivered to the integrated circuit when it is time for the drivers to access data bus 16. The data bits are each assigned to a single And gate. Therefore, data bit 1 is assigned to And gate 28, data bit 2 is assigned to And gate 30, and so forth.

The driving means includes a plurality of drivers identified by alpha numeric character DVR1 through DVRK, where K is the last driver in the chain of drivers. The output terminal from each of the And gates is connected to a selected one of the drivers. Thus, And gate 28 is connected to driver 1, And gate 30 is connected to driver 2 and so forth. Likewise, the output from each driver is coupled to data bus 16. The detailed circuit diagram for each of the above-described functional blocks can be easily designed by one skilled in the art. Therefore, a showing and detailed description of the above functional blocks will not be given. Suffice it to say at this point that the drivers can be any conventional drivers or the driver set forth in the above referenced application filed on even date and assigned to the assignee of the present invention.

In operation, the controlled pulses which are generated by the phase lock loop gate selected drivers onto data bus 16 so that none of the drivers conduct simultaneously and peak total current on the bus is significantly reduced. Stated another way, the drivers are gated sequentially onto the bus. By using a phase locked loop (PLL) to precisely control the frequency of the VCO and by generating the VCO from a string of inverters in a ring oscillator configuration, a series of closely spaced signals are provided. These signals can be used to sequence the drivers over a relatively short period of the bus cycle without adversely affecting the throughput of data on the bus and, at the same time, solving the noise (i.e., di/dt and or dv/dt) problem which is associated with prior art design. The flexibility in phase locked loop design along with the ability to make subnanosecond inverter stage in present day VLSI CMOS technologies provide a way of generating precisely spaced edges that are very closely time spaced and hence, sequential multiplexing of the drivers can be accomplished within a relatively short time slot. Thus, the present invention maintains a data transfer cycle that is as short as possible while, at the same time, limiting the peak current transient by spacing the allowable intervals of drivers switching time as close together as possible.

Figure 2:
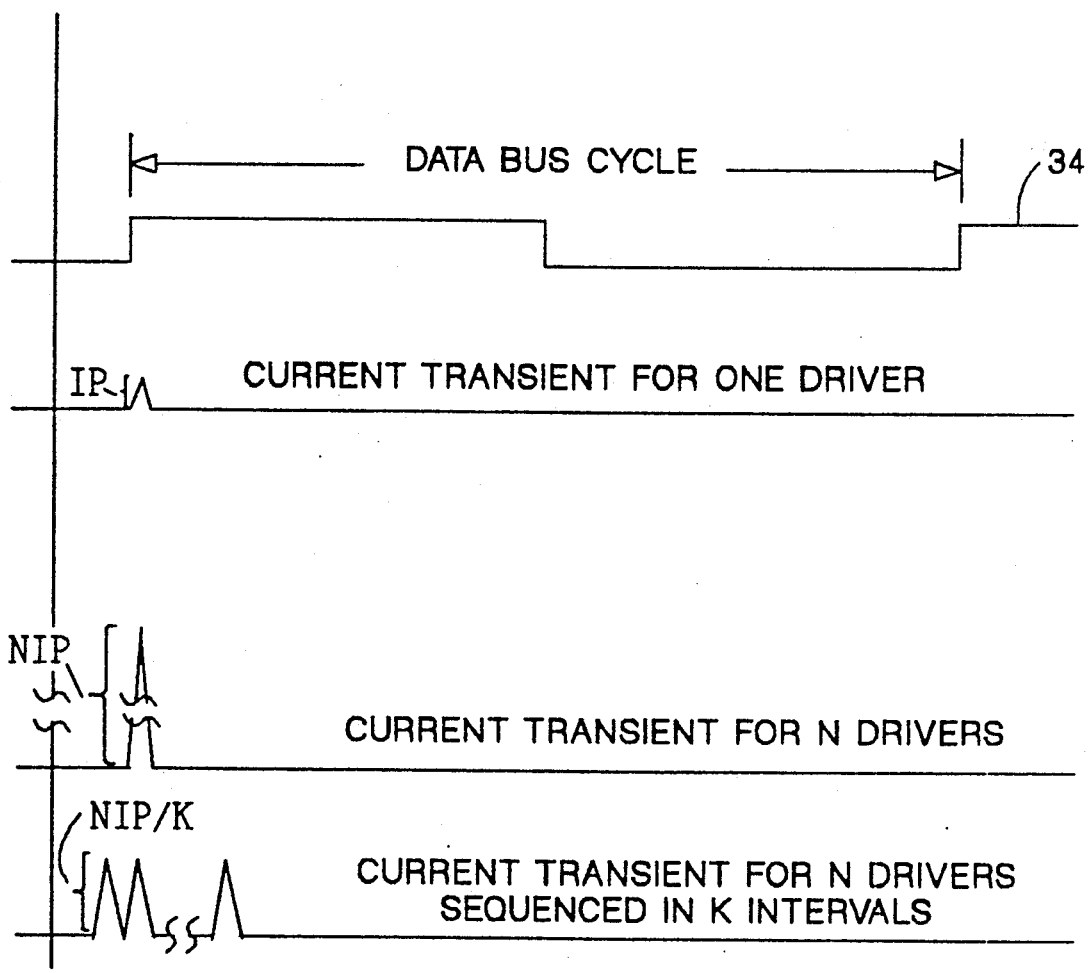
FIG. 2 shows a pictorial representation of current spikes generated by the drivers that are controlled according to the teachings of the present invention and non-controlled drivers. The figure is helpful in understanding the problem which the present invention solves.

FIG. 2 shows a graph which explains the problems associated with prior art drivers and the solution which the present circuit of FIG. 1 provides. Curve 34 represents a data cycle on data bus 16 (FIG. 1). Curve IP represents the current waveform for a single driver placing data on the bus, N being a variable number of drivers. Curve NIP represents current when N drivers are accessing the bus simultaneously. Curve NIP/K represents current transient for N drivers sequence over PK intervals.

For purposes of comparison, let us assume that the heights, along the current axis, of IP, NIP and NIP/K present relative magnitude of transient current on the data bus 16. Then, it can be seen from the sketch that the largest volume of current is on the bus when multiple drivers (NIP) are accessing it, simultaneously. Applicant's invention corrects this problem by multiplexing the drivers onto the bus so that the volume of current NIP/K is significantly less than the volume of current NIP. As discussed, the high volume of transient current on the data bus causes several problems which Applicant's invention corrects. The basic idea of Applicant's invention is to sequence the switching of the bus drivers in a controlled manner so that the transients are spread over a time interval which is relatively short when compared to the bus transfer cycle but allows time for some driver transients to end before others begin.

As is seen in FIG. 2, the current transient is a short spike occurring during the charge or discharge of the capacitance load on the driver. This usually occurs during the first few nanoseconds of the data bus cycle. The total current on the power rails is the sum of the driver currents and for N drivers on the bus, the sum could be as large as $N \times IP$, where IP is the peak current for a single driver. By spreading the total transient time for all drivers over the larger interval, say $K \times T1$, where T1 is a transient time for a driver, and restricting the maximum number of drivers that can switch at any one time to N/K, the peak current can be reduced by the factor N/K.

Figure 3:
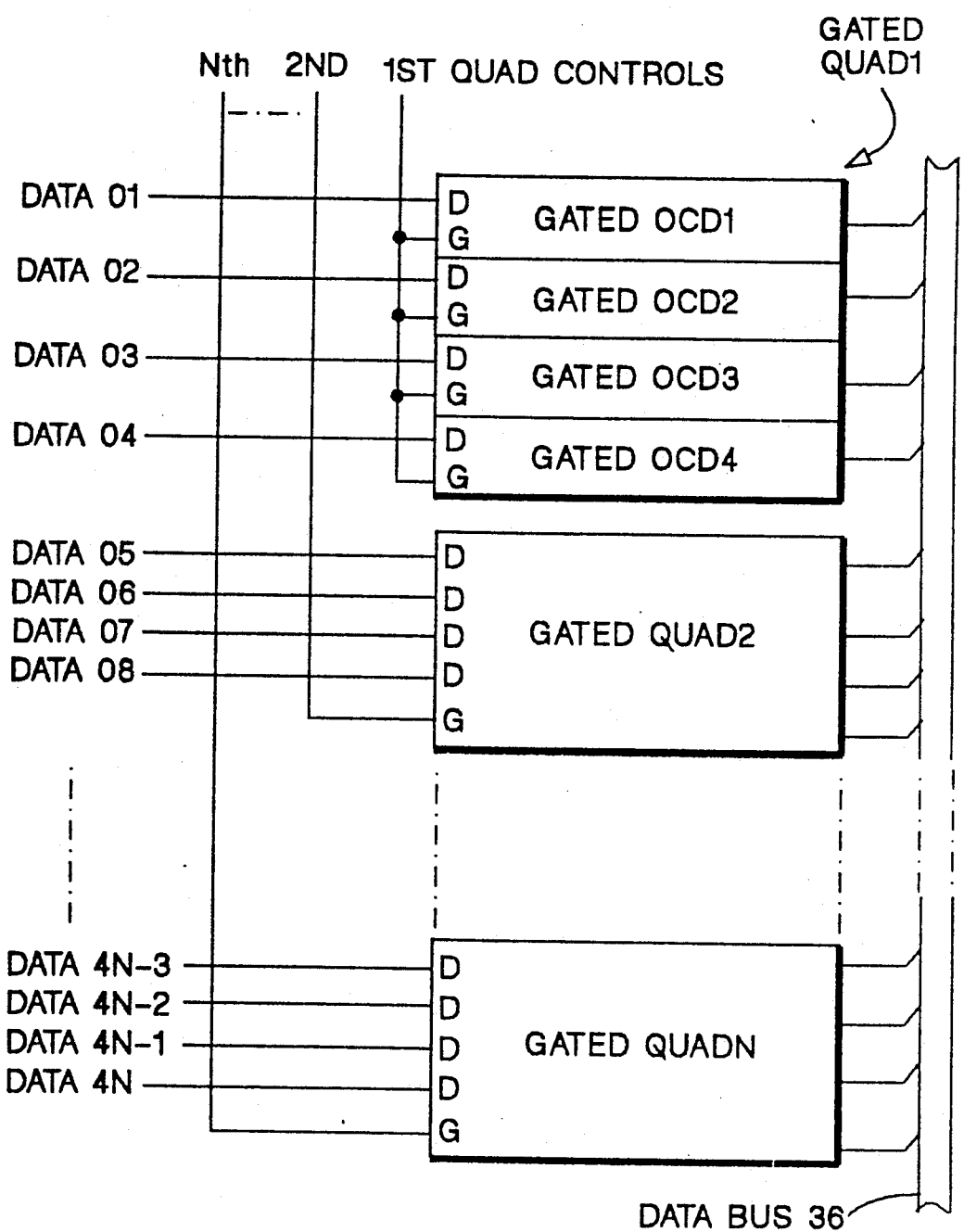
FIG. 3 shows a circuit arrangement wherein a group of drivers are sequenced onto a bus.

FIG. 3 shows an alternate embodiment of the present invention. In this configuration, a single pulse train generated from selected inverters in the VCO string is used for gating groups of off-chip drivers (OCD) onto data bus 36. With reference to FIG. 3, the drivers are grouped in sets of four identified as gated quad 1, gated quad 2 through gated quad N. It should be noted that any number of gated OCD can be grouped and this quad grouping is merely illustrative and should not be construed as a limitation on the scope of the present invention.

Still referring to FIG. 3, each of the gated quad sets are identical, therefore, only one will be described, it being understood that the others are structured and operate in an identical fashion. Gated quad 1 has four gated OCD identified as OCD1 through OCD4. Each of the gated OCD includes an off-chip driver (OCD) coupled to an And gate as is shown and described in FIG. 1. Each of the gated OCD has a data terminal labeled D and a control terminal labeled G. The data terminal accepts data while the gate terminal (G) accepts one of the quad controls labeled first, second, through Nth. The quad controls in FIG. 3 are generated by a phase locked loop similar to the one of FIG. 1. Thus, the quad control labeled first would be generated from inverter 1 (FIG. 1), the quad control labeled second would be generated from inverter 2 and so forth.

For applications where N sequence transients consumes too much of the data bus cycle time, one could consider grouping multiple drivers for simultaneous transfer. With the present quad grouping, the total transfer time is reduced by a factor of 4 when compared to individual sequencing. The optimum driver grouping will be vary application and technology dependent, but the scheme described here provides greater flexibility to the chip designer in the area of power bus sizing, noise coupling, packaging constraints, and FCC EMI compatibility. For the large VLSI chips with multiple bus designs, the total chip current transient can be controlled by gating buses instead of drivers sequentially. The circuit and techniques for gating buses are similar to those for gating drivers.

While the invention has been particularly shown and described with reference to the preferred embodiment thereof, it will be understood by those skilled in the art that various changes in form and details may be made therein without departing from the spirit and scope of the invention.

What is claimed is:

1. A VLSI chip comprising:
    a bus for transmitting data within a predetermined bus transfer cycle time;
    a plurality of driver modules, each one having an output node coupled to said bus;
    a plurality of logical AND gates, with each one coupled to each of the plurality of driver modules;
    a controller means coupled to the plurality of logical AND gates, said controller means generating gating pulses that sequence the AND gates so that output signals from said AND gates are presented sequentially to said driver modules whose use of the bus are spread over a time interval which is relatively short when compared to the predetermined bus transfer cycle time.

2. A VLSI chip comprising:
    a bus for transmitting data;
    a plurality of driver modules, each one having an output node coupled to said bus; and
    a controller means including a phase lock loop coupled to the driver modules, said controller means sequencing the switching of the driver modules in a controlled manner so that output signals from said driver modules are spread over a time interval which is relatively short when compared to the bus transfer cycle.

3. The VLSI chip of claim 2 wherein the phase lock loop includes a phase detector circuit means;
    a low pass filter circuit coupled to said phase detector circuit means; and
    a multi-stage ring VCO coupled to said low pass filter circuit with each stage of the multi-stage ring VCO controlling a selected one of the the driver modules.

4. The VLSI chip of claim 3 wherein each stage of the multistage ring VCO controls a selected group of the driver modules.

5. An improved integrated circuit arrangement comprising:
    a bus for transmitting data;
    a plurality of driver circuits coupled to the bus; and
    a phase locked loop coupled to said plurality of drivers, said phase locked loop generating a plurality of relatively closed spaced pulses that sequence the drivers onto the bus.

6. The improved integrated circuit arrangement of claim 5 wherein the phase locked loop includes a multi-stage VC ring oscillator;
    a low pass filter circuit coupled to an input of said VC ring oscillator; and
    a phase detector circuit having an output terminal coupled to the low pass filter circuit, an input terminal coupled to an input clock line and another input terminal coupled to a feedback conductor interconnecting an output terminal of the VC ring oscillator to its input.

7. The improved integrated circuit arrangement of claim 6 wherein the ring oscillator further includes means for adjusting the period of the VCO positioned in the feedback conductor.

8. The improved integrated circuit arrangement of claim 7 wherein the means includes a logic divide circuit.

9. The improved integrated circuit arrangement of claim 6 wherein the multi-stage VC ring oscillator includes a string of series connected inverter circuits.

* * * * *